(12) United States Patent
Francis et al.

(10) Patent No.: US 11,196,412 B1
(45) Date of Patent: Dec. 7, 2021

(54) TECHNIQUE TO IMPROVE BANDWIDTH AND HIGH FREQUENCY RETURN LOSS FOR PUSH-PULL BUFFER ARCHITECTURE

(71) Applicant: Xilinx, Inc., San Jose, CA (US)

(72) Inventors: Roswald Francis, Dublin (IE); Bruno Miguel Vaz, Alcabideche (PT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/732,851

(22) Filed: Jan. 2, 2020

(51) Int. Cl.
*H03K 17/687* (2006.01)
*H03K 17/12* (2006.01)
*H03M 1/12* (2006.01)

(52) U.S. Cl.
CPC ....... *H03K 17/122* (2013.01); *H03K 17/6872* (2013.01); *H03M 1/12* (2013.01)

(58) Field of Classification Search
CPC .... H03K 17/122; H03K 17/6872; H03M 1/12
USPC ........................................................ 327/437
See application file for complete search history.

(56) References Cited

U.S. PATENT DOCUMENTS

| | | | |
|---|---|---|---|
| 7,928,489 B2 | 4/2011 | Ando | |
| 2003/0184381 A1* | 10/2003 | Wyman | H03F 3/45 330/277 |
| 2011/0304576 A1* | 12/2011 | Fasshauer | H03K 17/955 345/174 |
| 2014/0018028 A1* | 1/2014 | Lemkin | H04B 1/18 455/269 |

OTHER PUBLICATIONS

Thorlabs, Rise Time, Frequency Response, and 3dB Bandwidth, Apr. 1, 2019, [online], [retrieved on Nov. 7, 2019]. Retrieved from the Internet <https://www.thorlabs.com/images/TabImages/Rise_Time_3dB_Bandwidth_Relationship_Lab_Fact.pdf>, 26 pages.
Ye, Le et al., A 0.47mW 6th-Order 20MHz Active Filter Using Highly Power-Efficient Opamp, 2011 IEEE ISCAS (978-1-4244-9474-3/11), p. 1640-1643, 4 pages, May 2011.

* cited by examiner

*Primary Examiner* — Metasebia T Retebo
(74) *Attorney, Agent, or Firm* — Patterson + Sheridan, LLP

(57) ABSTRACT

Apparatus and associated methods relate to an input buffer having a source follower connected in series with a push-pull driver to generate a shield reference node that provides conductive traces extending from the shield reference node and disposed between gate traces of the input buffer and a corresponding nearest reference potential node. In an illustrative example, the push-pull driver and the source follower may be capacitively coupled, via the gate traces, to receive an input signal from an input node. In some examples, the shield reference node may also include conductive traces disposed between the input node and/or the gate traces and a corresponding nearest reference potential node such that parts of parasitic capacitances in the input buffer may be shielded. Accordingly, the bandwidth of the input buffer may be advantageously improved. The high frequency return loss ($S_{11}$) may also be improved accordingly.

20 Claims, 11 Drawing Sheets

TECHNIQUE TO IMPROVE BANDWIDTH AND HIGH FREQUENCY RETURN LOSS FOR PUSH-PULL BUFFER ARCHITECTURE

TECHNICAL FIELD

Various embodiments relate generally to integrated circuits and, more specifically, to buffers.

BACKGROUND

Data represents information that has useful value. Data can take the form of stored information. Data storage can be in analog form. Data storage can also be in digital form. Data in digital format may be communicated between two nodes. At a receiver in a digital communication system, a digitally encoded data stream may be received as an analog signal and converted to a digital format by an analog-to-digital converter (ADC). The ADC interprets the data stream as a function of time. For example, some ADCs may be synchronized to a clock signal that determines when a voltage signal is to be sampled.

In integrated circuit applications, ADCs may typically perform critical timing functions using one or more circuit stages that are implemented with transistors. In various ADC circuits, some of the transistors may operate in a linear mode to process analog signals. In some ADC circuits, certain transistors may be designed to operate as ideal switches (e.g., digital signals). An ideal transistor switch may operate in either an on state or an off state in response to a control signal. In practice, however, transistors in real integrated circuits may exhibit non-ideal behavior related to intrinsic device properties and/or extrinsic parameters such as, for example, device process parameters, applied voltage, and device temperature.

SUMMARY

Apparatus and associated methods relate to an input buffer having a source follower connected in series with a push-pull driver to generate a shield reference node that provides conductive traces extending from the shield reference node and disposed between gate traces of the input buffer and a corresponding nearest reference potential node. In an illustrative example, the push-pull driver and the source follower may be capacitively coupled, via the gate traces, to receive an input signal from an input node. In some examples, the shield reference node may also include conductive traces disposed between the input node and/or the gate traces and a corresponding nearest reference potential node such that parts of parasitic capacitances in the input buffer may be shielded. Accordingly, bandwidth of the input buffer may be advantageously improved. The high frequency return loss ($S_{11}$) may also be improved as the effective input capacitance seen by the input buffer is less.

Various embodiments may achieve one or more advantages. For example, some embodiments may improve, for example, the input and output bandwidth of the input buffer without consuming any extra power. Some embodiments may also improve the return loss of the input buffer, especially at high frequency. Some embodiments may also improve input amplitude attenuation across PVT (process, voltage, temperature), for example.

In one exemplary aspect, a circuit includes (a) a first transistor configured as a cascode source follower between a voltage supply node and a shield reference node. The circuit also includes (a) an input buffer circuit comprising a second transistor and a third transistor each configured as a source follower in a push-pull driver with an output node, the push-pull driver coupled between the shield reference node and a reference potential node, wherein each of the first, second, and third transistors comprise respective input gates that are each capacitively coupled via a first gate trace, a second gate trace, and a third gate trace, respectively, to receive an input signal from an input node. The circuit also includes (c) a circuit includes: (a) a shield node providing one or more conductive traces extending from the shield reference node and disposed, respectively, between each one of the first, the second, and the third gate traces and a respective corresponding nearest reference potential node.

In some embodiments, the circuit may also include a first capacitor, a second capacitor, and a third capacitor each having a respective first plate and a respective second plate. Each of respective first plates may be electrically connected to the input node, and each of respective second plates may be electrically connected to the respective input gates via the first gate trace, the second gate trace, and the third gate trace, respectively. In some embodiments, at least one of the one or more conductive traces extending from the shield reference node may be disposed on an intermediate layer between a first layer containing the input gates and a second layer containing the reference potential.

In some embodiments, at least one of the one or more conductive traces extending from the shield reference node may be disposed on a layer containing the input gates and the reference potential. In some embodiments, the shield node may also provide one or more conductive traces extending from the shield reference node and disposed between the input node and a corresponding nearest reference potential node. In some embodiments, the one or more conductive traces extending from the shield reference node and disposed between the input node and a corresponding nearest reference potential node may be disposed on an intermediate layer between a first layer containing the input gates and a second layer containing the reference potential.

In some embodiments, the one or more conductive traces extending from the shield reference node and disposed between the input node and a corresponding nearest reference potential node may be disposed on a layer containing the input gates and the reference potential. In some embodiments, the reference potential node may be a circuit ground. In some embodiments, the first transistor and the second transistor may be N-type metal-oxide-mem inductor field-effect-transistors (NMOSFETs).

In some embodiments, the third transistor may be a P-type metal-oxide-mem inductor field-effect-transistor (PMOSFET). In some embodiments, the circuit may also include an analog-to-digital converter (ADC) coupled to the output node. In some embodiments, the circuit may also include (1) a first resistor having a first terminal and a second terminal, wherein the first terminal is configured to receive a source voltage signal, and the second terminal is coupled to the input node, and (2) a termination resistor having a third terminal and a fourth terminal, wherein the third terminal is coupled to the input node, and the fourth terminal is coupled to a low impedance voltage level.

In another exemplary aspect, a method includes configuring a first transistor as a cascode source follower and coupling the first transistor between a voltage supply node and a shield reference node, providing an input buffer circuit having a second transistor and a third transistor, configuring each of the second transistor and third transistor as a source follower in a push-pull driver with an output node, coupling the push-pull driver between the shield reference node and a reference potential node, capacitively coupling respective input gates of each of the first, second, and third transistors via a first gate trace, a second gate trace, and a third gate trace, respectively, to receive an input signal from an input node, providing a shield node having one or more conductive traces extending from the shield reference node, and, disposing the one or more conductive traces between a respective corresponding nearest reference potential node and each one of the first, the second, and the third gate traces, respectively.

In some embodiments, the capacitively coupling may include providing a first capacitor, a second capacitor, and a third capacitor each having a respective first plate and a respective second plate, electrically connecting each respective first plate of the first capacitor, the second capacitor, and the third capacitor to the input node, and, electrically connecting each respective second plate of the first capacitor, the second capacitor, and the third capacitor to the respective input gates via the first gate trace, the second gate trace, and the third gate trace, respectively.

In some embodiments, at least one of the one or more conductive traces extending from the shield reference node may be disposed on an intermediate layer between a first layer containing the input gates and a second layer containing the reference potential. In some embodiments, at least one of the one or more conductive traces extending from the shield reference node may be disposed on a layer containing the input gates and the reference potential. In some embodiments, the shield node may also provide one or more conductive traces extending from the shield reference node and disposed between the input node and a corresponding nearest reference potential node.

In some embodiments, the one or more conductive traces extending from the shield reference node and disposed between the input node and a corresponding nearest reference potential node may be disposed on an intermediate layer between a first layer containing the input gates and a second layer containing the reference potential. In some embodiments, the one or more conductive traces extending from the shield reference node and disposed between the input node and a corresponding nearest reference potential node may be disposed on a layer containing the input gates and the reference potential. In some embodiments, the reference potential node may be a circuit ground.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to an input buffer having a source follower connected in series with a push-pull driver to generate a shield reference node that provides conductive traces extending from the shield reference node and disposed between gate traces of the input buffer and a corresponding nearest reference potential node (GND). In an illustrative example, the input buffer may include capacitive level shifters. Each top plate may be coupled to respective gate terminals of transistors through the gate traces. Bottom plates of the capacitive level shifters may be coupled to receive an input signal through a first plurality of routing traces. The conductive traces may be further arranged between the first plurality of routing traces and a reference potential node such that parasitic capacitances introduced by the capacitive level shifters may be shielded. Accordingly, the bandwidth of the input buffer may be advantageously improved. The high frequency return loss ($S_{11}$) may also be improved as the effective input capacitance seen by the input buffer is less.

To aid understanding, this document is organized as follows. First, an exemplary platform (e.g., FPGA) suitable to perform an analog-to-digital conversion is briefly introduced with reference to FIG. 1. Second, with reference to FIGS. 2-5, the discussion turns to the structure and method used to compensate parasitic capacitances in an input buffer. Then, with reference to FIG. 6A-6D, the discussion discloses exemplary simulation results of the exemplary parasitic capacitances compensated input buffer. Finally, with reference to FIG. 7, another exemplary platform (e.g., SOC) that is suitable to perform the analog-to-digital conversion is further discussed.

Figure 1:
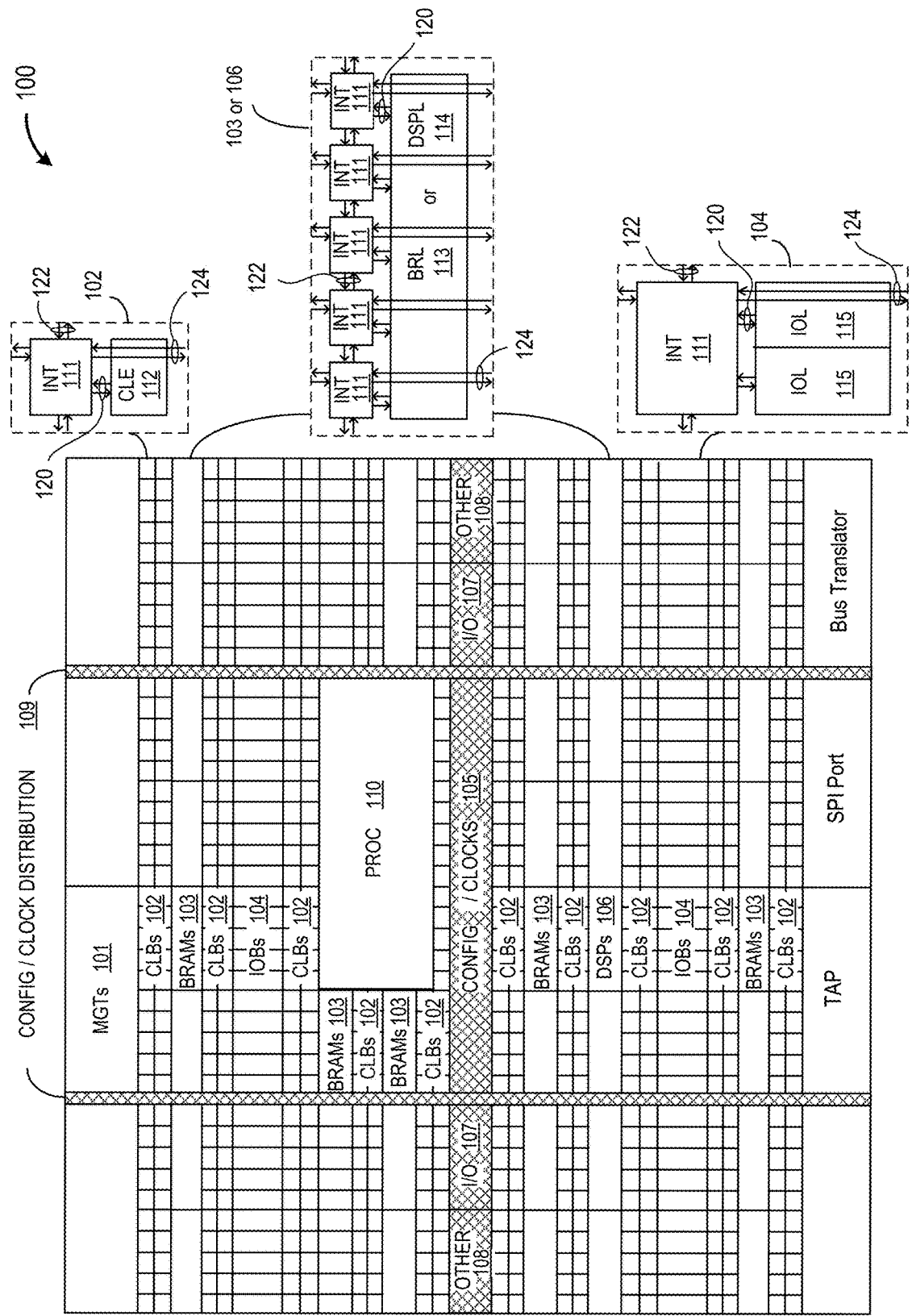
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

At least one transceiver may be embedded in the FPGA to perform data transmitting and data receiving during communication. Analog-to-digital conversion is the process of converting a continuous range of analog signal levels into digital codes. Analog signal levels can be converted into digital voltages, digital currents, or digital charge signals using an ADC. ADCs may be used in many applications, for example, communication systems. In some applications, ADCs with high sampling rates may include an input buffer configured to isolate ADCs from other devices. A parasitic capacitor compensation technique may be implemented in the input buffer to improve the bandwidth and return loss (S11) of the input buffer, which may advantageously improve the performance of the ADCs.

Figure 2:
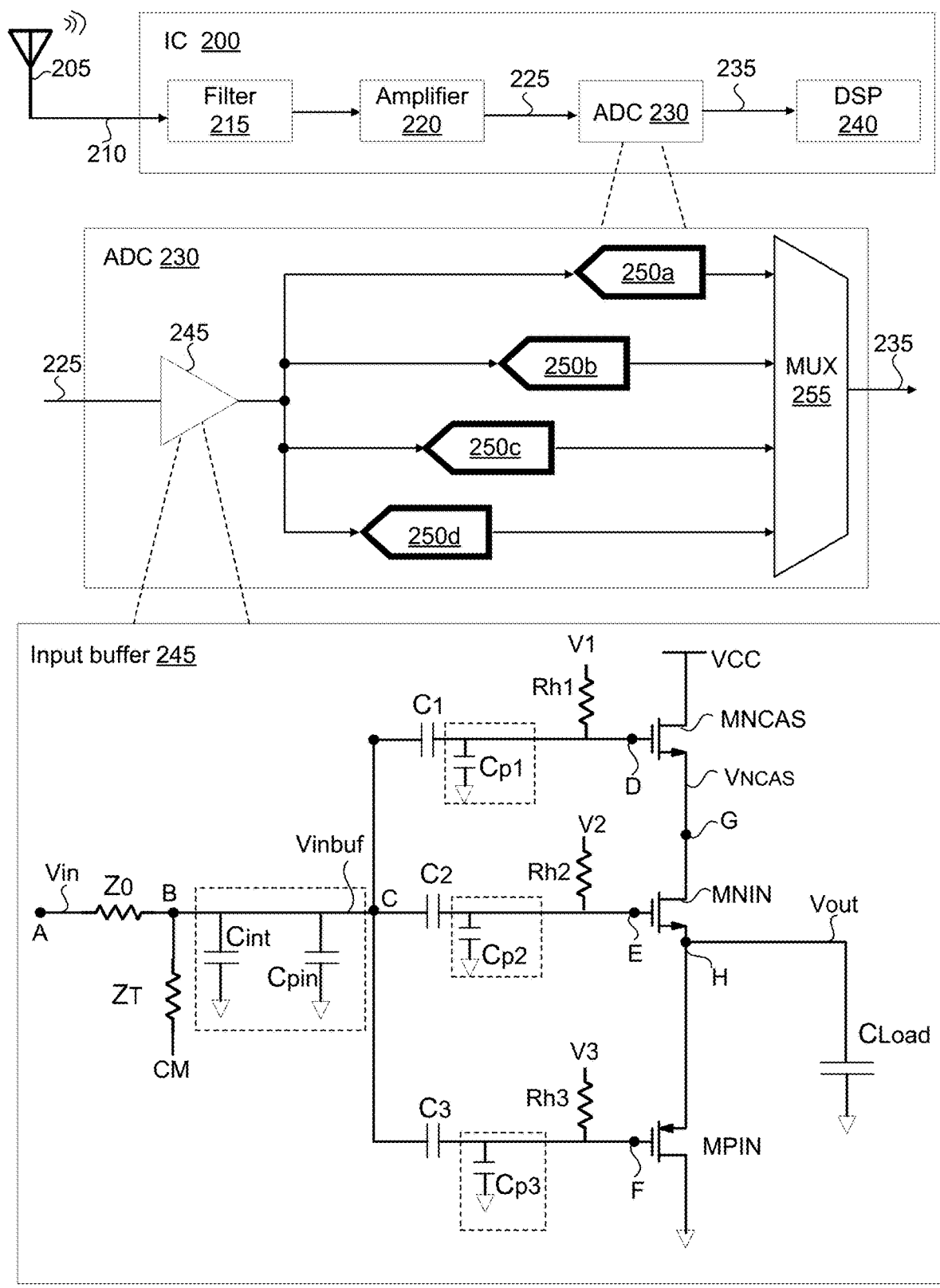
FIG. 2 depicts an exemplary interleaving analog-to-digital converter (ADC) with an input buffer.

FIG. 2 depicts an exemplary interleaving analog-to-digital converter (ADC) with an input buffer. In this depicted example, an integrated circuit (IC) 200 (e.g., FPGA) is used in a communication system. For example, the IC 200 may be implemented in a base station to receive analog signals from a mobile device. In this depicted example, the IC 200 is configured to receive, by using an antenna 205, an analog signal 210. The IC 200 includes a filter 215 that filters errors and/or noises in the analog signal 210. The filtered analog signal is amplified by an amplifier 220 to generate a processed analog signal 225. The processed analog signal 225 is converted to a digital signal 235 through an analog-to-digital converter (ADC) system 230. The digital signal 235 is then processed by a digital signal processor (DSP) 240, for example. High-speed electronics (e.g., 5G technologies) may require ADCs having a high sampling rate. For example, a receiver may utilize a 5-Gigasamples-per-second (GSPS) ADC (e.g., RFADC), with a 6-GHz, DC-coupled, fully differential amplifier front end. An input buffer 245 of the ADC 230 may be used to isolate the ADC 230 from other devices (e.g., filter 215, amplifier 220) to reduce noises (e.g., kickback noises) injected to the ADC 230. A significant part of parasitic capacitances introduced by the input buffer may be advantageously compensated to improve the performance of the ADC 230, especially at high frequency.

Time-interleaving ADCs may be used to achieve a high sampling rate. For example, by using a time-interleaved ADC that includes four sub-ADCs, each of the four sub-ADCs may only need to have a sampling rate that is 1.25 GSPS, for example. In this depicted example, the processed analog signal 225 is received by an input buffer 245 and is then sampled by four sub-ADCs 250*a*, 250*b*, 250*c*, 250*d*. Each of the four sub-ADCs 250*a*, 250*b*, 250*c*, 250*d* may be driven by a sampling driver circuit (not shown). Each of the sub-ADCs 250*a*, 250*b*, 250*c*, 250*d* connects with a selection circuit 255 (e.g., a multiplexer). The selection circuit 255 selectively outputs the signals sampled by the four sub-ADCs 250*a*, 250*b*, 250*c*, 250*d* to form the digital signal 235. In some embodiments, each sub-ADCs 250*a*, 250*b*, 250*c*, 250*d* may also include its own input buffer.

In this depicted example, the input buffer 245, used to isolate the sub-ADCs 250*a*, 250*b*, 250*c*, 250*d* from other devices (e.g., filter 215, amplifier 220), includes, a first resistor $Z_0$ (e.g., port resistance) having a first terminal A and a second terminal. The first terminal A is coupled to, for example, the amplifier 225 to receive a voltage signal $V_{in}$ (e.g., the processed analog signal 225). The second terminal is coupled to a node B. The input buffer 245 also includes a second resistor $Z_T$ (e.g., termination resistor) coupled between the node B and a common mode node (i.e., half of the supply voltage $V_{CC}$).

The input buffer 245 also includes a first capacitive level shifter $C_1$, a second capacitive level shifter $C_2$, and a third capacitive $C_3$ level shifter used for biasing. The bottom plates of the three capacitive level shifters $C_1$, $C_2$, $C_3$ are connected to a node C. The node B is connected to node C.

The input buffer 245 also includes a push-pull buffer stage having a first N-type metal-oxide-semiconductor field-effect-transistor (NMOSFET) MNIN and a first PMOSFET MPIN. The source terminal of the transistor MNIN and the source terminal of the MPIN are connected at an output node H to output a buffered voltage $V_{out}$ in response to the voltage signal $V_{in}$. The buffered voltage $V_{out}$ may be then received by the sub-ADCs. In this depicted example, the input buffer 245 also includes a second NMOSFET (cascade transistor) MNCAS coupled between a power supply and the drain terminal of the transistor MNIN to improve the gds (drain-source transconductance) non-linearity of the transistor MNIN. The gate terminals D, E, F of the transistor MNCAS, the transistor MNIN, and the transistor MPIN are connected to a corresponding top plate of the three capacitive level shifters $C_1$, $C_2$, $C_3$, respectively.

In this depicted example, the input buffer 245 also includes three bias resistors Rh1, Rh2 and Rh3 coupled between a corresponding bias voltage V1, V2, V3 and a corresponding gate terminal (e.g., gate terminals D, E, F), respectively. The three bias resistors are configured to transfer the DC/static bias voltage from bias circuits (not shown in diagrams) to the gates of the buffer transistors. This way the biasing of the buffer transistors for a particular static buffer current from supply and static output voltage may be defined. For example, Rh1 may define a static (e.g., DC, under no signal) voltage $V_{NCAS}$ at node G. Rh2 and Rh3 may define the static voltage $V_{OUT}$ at node H and static current through the buffer from supply, respectively.

In this depicted example, parasitic capacitances of the input buffer are also shown. For example, parasitic capacitances introduced by pad and routing are expressed as $C_{int}$. These parasitic capacitances are intrinsic and may be hard to be removed or compensated. Parasitic capacitances between the bottom plates and the ground plane are shown as $C_{pin}$. Parasitic capacitances introduced by top plates of the three capacitive level shifters $C_{p1}$, $C_2$ and, $C_3$ are expressed as $C_{p1}$, $C_{p2}$, and $C_{p3}$, respectively. The values of the $C_{p1}$, $C_{p2}$, and $C_{p3}$ may be about 2% of the value of the capacitive level shifter (e.g., $C_1=C_2=C_3=3$ pF). One terminal of the top plate related parasitic capacitances $C_{p1}$, $C_{p2}$, and $C_{p3}$ are coupled between the corresponding level shifter ($C_1$, $C_2$ and, $C_3$) and the corresponding gate terminals (terminals D, E, F of the transistor MNCAS, the transistor MNIN, and the transistor MPIN), respectively. The other terminal of the parasitic capacitances $C_{p1}$, $C_{p2}$, and $C_{p3}$ are coupled to a corresponding reference potential node (e.g., ground or other low impedance voltage level).

In this depicted example, one terminal of the pad and routing parasitic capacitance $C_{int}$ is coupled to the node C, the other terminal of the parasitic capacitance $C_{int}$ is coupled to a reference potential node (e.g., ground or other low impedance voltage level). One terminal of the bottom plate parasitic capacitance $C_{pin}$ is also coupled to node C. The other terminal of the parasitic capacitance $C_{pin}$ is also coupled to a reference potential node (e.g., ground or other low impedance voltage level). Because of the resistances (e.g., $Z_0$, $Z_T$) and the parasitic capacitances $C_{int}$ and $C_{pin}$, a voltage $V_{inbuf}$ at node C is expressed as $V_{inbuf}$ rather than $V_{in}$. As the transistor MNCAS acts as a source follower, a cascode voltage $V_{NCAS}$ at node G (the source terminal of the transistor MNCAS) may be substantially equal to $V_{inbuf}$.

The 3 dB bandwidth of the input side of the input buffer 245 may be expressed as $$f_{3dB} = \frac{1}{2\pi * R * (C_{int} + C_{pin} + C_{p1} + C_{p2} + C_{p3})}$$

R is the input impedance of the input buffer. The parasitic capacitances $C_{int}$, $C_{pin}$, $C_{p1}$, $C_{p2}$, and $C_{p3}$ disadvantageously reduce the bandwidth and degrade the high-frequency return loss (S11) of the input buffer 245. Here the device inputs capacitances (e.g., parasitic capacitances $C_{gd}$ of transistor MNCAS and transistor MPIN) are neglected. The parasitic capacitances $C_{pin}$, $C_{p1}$, $C_{p2}$, and $C_{p3}$ may be effectively shielded by injecting the cascode voltage $V_{NCAS}$ into the parasitic capacitances $C_{pin}$, $C_{p1}$, $C_{p2}$, and $C_{p3}$. Accordingly, the bandwidth of the input buffer 245 may be advantageously improved. An exemplary architecture of an input buffer with injected voltage signal applied to the parasitic capacitances $C_{pin}$, $C_{p1}$, $C_{p2}$, and $C_{p3}$ are discussed in detail with reference to FIG. 3.

Figure 3:
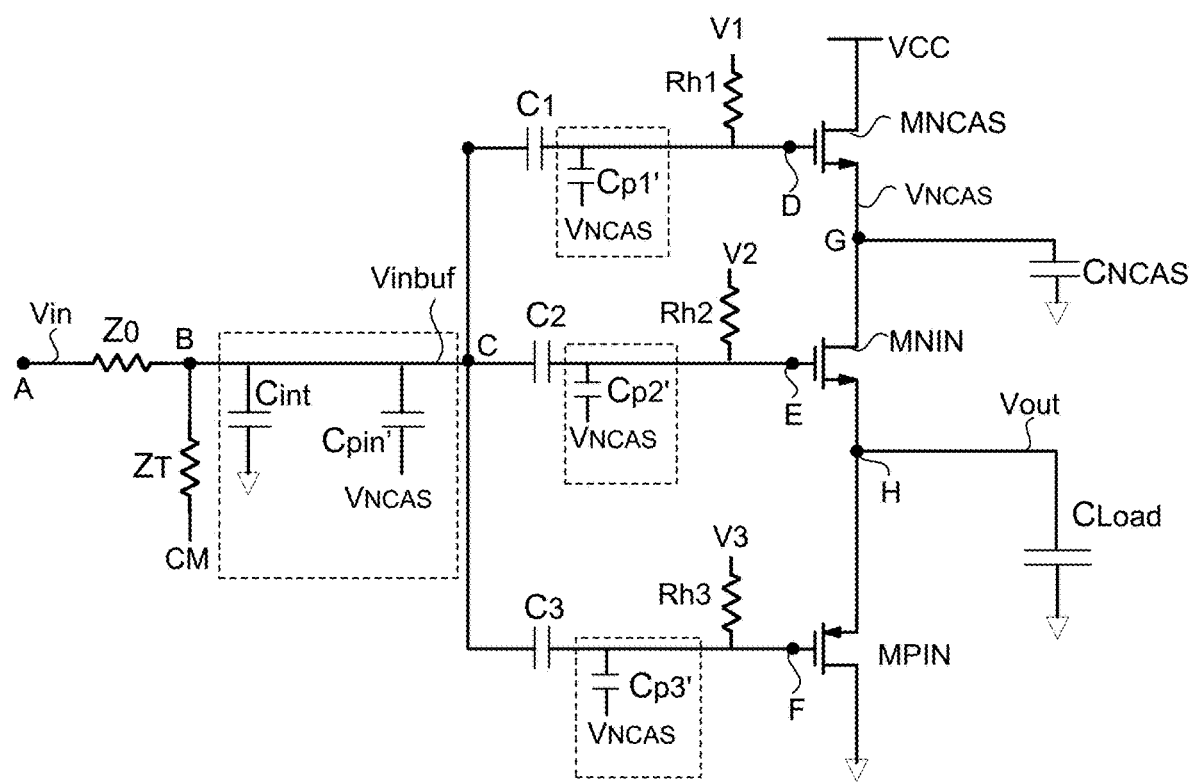
FIG. 3 depicts a schematic view of an exemplary parasitic capacitor compensated input buffer.

FIG. 3 depicts a schematic view of an exemplary parasitic capacitor compensated input buffer. As shown in the input buffer model 300, the cascode voltage $V_{NCAS}$ at node G is injected to the parasitic capacitances $C_{pin}$, $C_{p1}$, $C_{p2}$, and $C_{p3}$. And the parasitic capacitances $C_{pin}$, $C_{p1}$, $C_{p2}$, and $C_{p3}$ become parasitic capacitances $C_{pin'}$, $C_{p1'}$, $C_{p2'}$, and $C_{p3'}$. The values of the new parasitic capacitances $C_{pin'}$, $C_{p1'}$, $C_{p2'}$, and $C_{p3'}$ are dependent on the distances between a first routing trace that supplies $V_{inbuf}$ and a second routing trace that supplies the cascode voltage $V_{NCAS}$. As the transistor MNCAS acts as a source follower, the cascode voltage $V_{NCAS}$ at node G is substantially equal to the voltage $V_{inbuf}$ at node C. Thus, there will be no potential difference across the parasitic capacitances $C_{pin'}$, $C_{p1'}$, $C_{p2'}$, and $C_{p3'}$, which may shield the effect of the corresponding parasitic capacitances. After shielding the parasitic capacitances $C_{pin}$, $C_{p1}$, $C_{p2}$, and $C_{p3}$, the 3 dB bandwidth may be expressed as $$f_{3dB} = \frac{1}{2\pi * R * C_{int}}$$

R is the input impedance of the input buffer. The input 3 dB bandwidth is improved by a ratio of $$\frac{C_{int}}{C_{int} + C_{pin} + C_{p1} + C_{p2} + C_{p3}}.$$

This ratio may be as high as 1.3, implying a 30% improvement in 3 dB bandwidth at the input of the input buffer. The return loss (S11) may also be improved at high frequencies due to the compensation of the parasitic capacitances. By this way of shielding, a new parasitic capacitance $C_{NCAS}$ is added to the cascode node G. However, the new added parasitic capacitance $C_{NCAS}$ will not influence the 3 dB bandwidth of the input buffer as the cascode node G has almost half the drivability of the output node H.

Figure 4A:
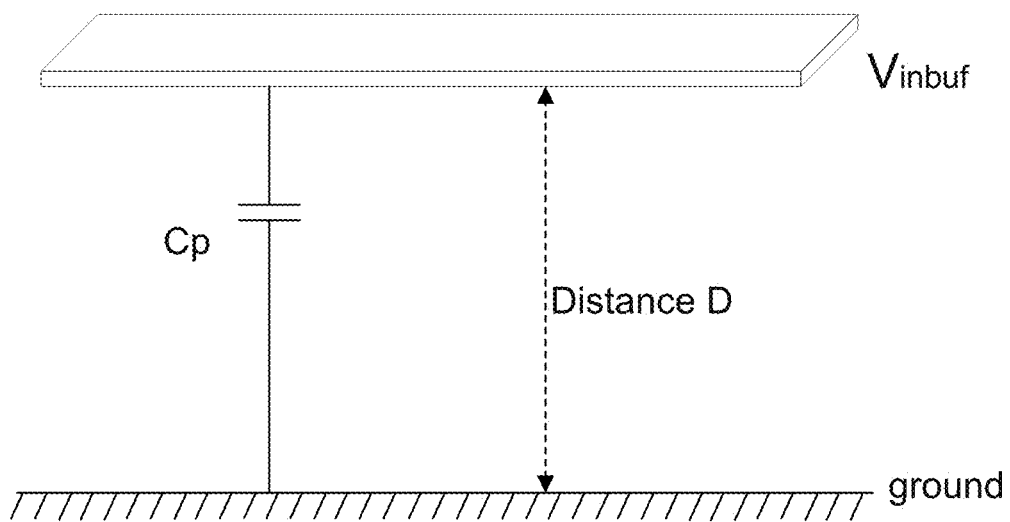
FIGS. 4A-4B depict exemplary arrangements of routing traces of an input signal received by an input buffer before and after shielding parasitic capacitances.
Figure 4B:
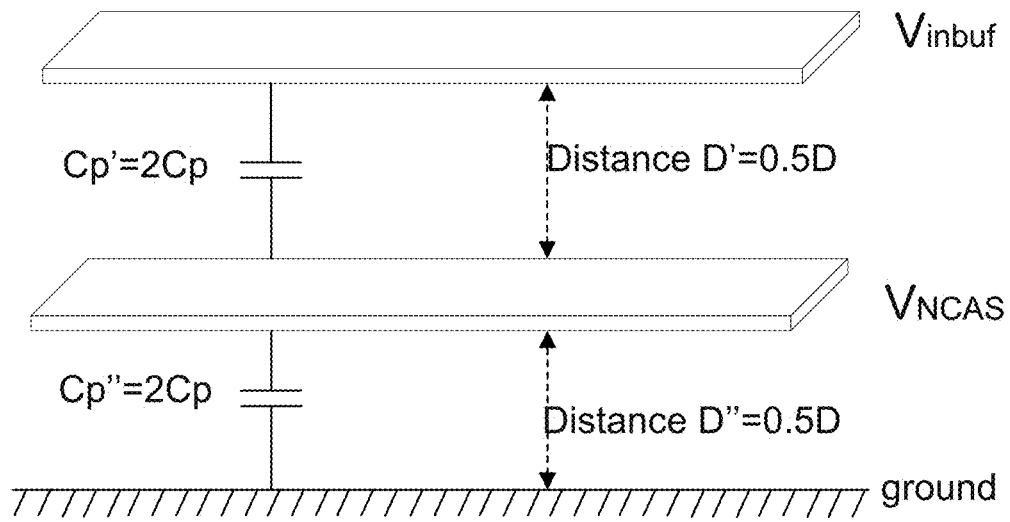

FIGS. 4A-4B depict exemplary arrangements of routing traces of an input signal received by an input buffer. As shown in FIG. 4A, before shielding, the parasitic capacitance $C_P$ is introduced between the ground plane (e.g., substrate of an integrated circuit, or other circuit reference potential node) and a first routing trace connected to bottom plates to supply the input voltage $V_{inbuf}$. The distance between the first routing trace and the ground plane may be expressed as D. The parasitic capacitance $C_p$ may be shielded by arranging a second routing trace that has the cascode voltage $V_{NCAS}$ below the first routing trace connected to bottom plates. As shown in FIG. 4B, the distance between the first routing trace and the second routing trace is, for example, 0.5D, such that a first parasitic capacitance $C_{p'}$ between the two routing traces may be expressed as $C_{p'}=2C_p$, and a second parasitic capacitance $C_{p''}$ between the second routing trace and the ground plane may be expressed as $C_{p''}=2C_p$. The second parasitic capacitance Cr, is part of the new added parasitic capacitance $C_{NCAS}$. As the cascode voltage $V_{NCAS}$ is substantially equal to the input voltage $V_{inbuf}$, there will be substantially no voltage potential between the first routing trace and the second routing trace such that the first parasitic capacitance $C_{p'}$ may not be present. Although the second parasitic capacitance Cr, is introduced by the second routing trace, it may not influence the bandwidth of the input buffer as the cascode node G has almost half the drivability of the output node H.

Although in this depicted example, only vertical arrangement of the routing traces is shown (e.g., the second routing trace is disposed on an intermediate layer between a layer containing the input voltage $V_{inbuf}$ and the reference potential), in other embodiments, horizontal arrangement of the routing traces may also be possible. For example, the second routing trace may be disposed on a layer containing the input voltage $V_{inbuf}$ and the reference potential.

Figure 4C:
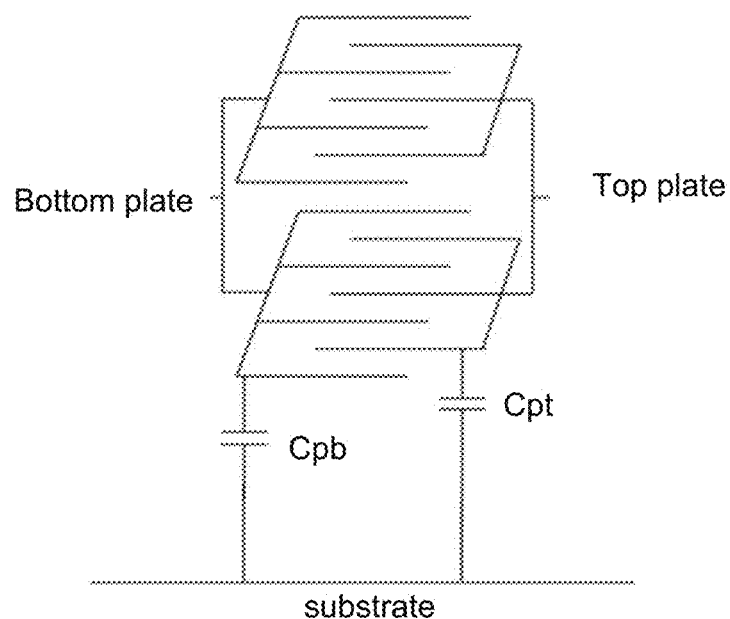
FIGS. 4C-4D depict exemplary arrangements of routing traces and layout of a metal-oxide-metal (MOM) capacitor implemented in the input buffer before and after shielding parasitic capacitances.
Figure 4D:
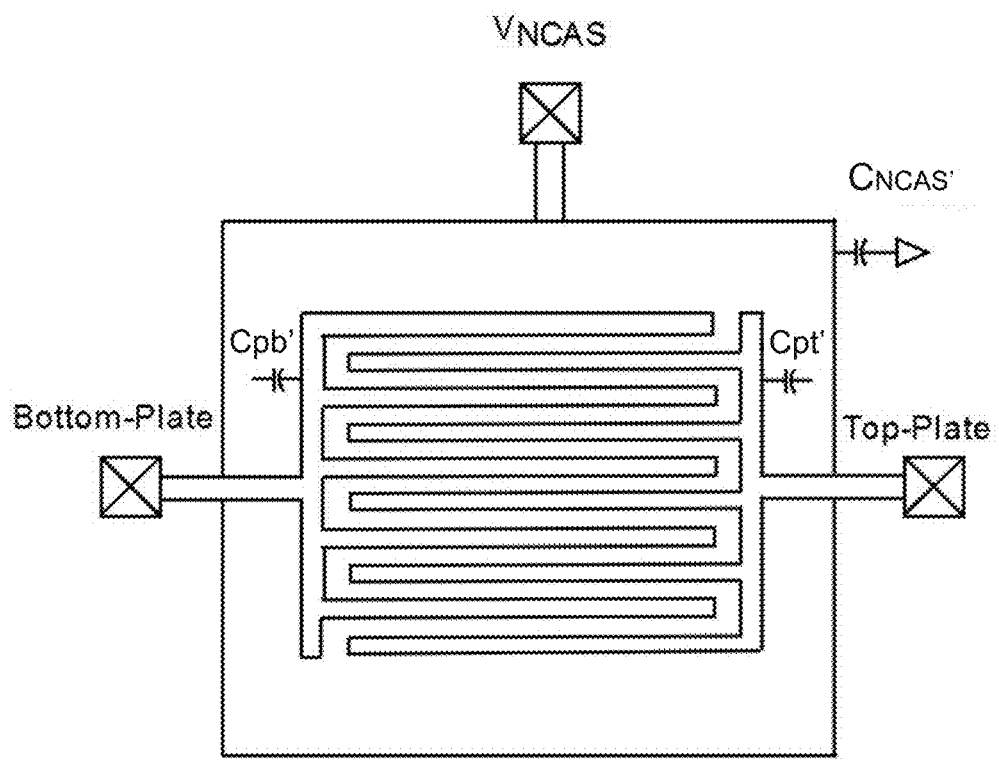

FIGS. 4C-4D depict exemplary arrangements of routing traces and layout of a metal-oxide-metal (MOM) capacitor implemented in the input buffer before and after shielding parasitic capacitances. An exemplary metal-oxide-metal (MOM) capacitor is shown in FIG. 4C. As discussed with reference to FIG. 2, the input buffer also includes a parasitic capacitance $C_{pt}$ (e.g., $C_{p1}$, $C_{p2}$, or $C_{p3}$) introduced by the top plate and a parasitic capacitance $C_{pb}$ introduced by the bottom plate of an exemplary MOM capacitor (e.g., $C_1$, $C_2$, or $C_3$) As shown in FIG. 4D, when the second routing trace (that has the cascode voltage $V_{NCAS}$) is arranged below the top plate and bottom plate of the MOM capacitor, parasitic capacitances may include a parasitic capacitance $C_{pb'}$ introduced by the trace having $V_{NCAS}$ and the bottom plate, a parasitic capacitance $C_{pt'}$ introduced by the trace having $V_{NCAS}$ and the top plate, and a parasitic capacitance $V_{NCAS'}$ introduced by the trace having $V_{NCAS}$ and circuit reference potential (e.g., ground). Parasitic capacitance $C_{pb'}$ is part of the parasitic capacitance $C_{pin'}$ shown in FIG. 2. Parasitic capacitance $C_{pb'}$ and parasitic capacitance $C_{pt'}$ may not be present as there is substantially no voltage potential between the top plates and the second routing trace. Therefore, parasitic capacitances related to the bottom plates and top plates of capacitive level shifters may be shielded. The bandwidth of the input buffer may be advantageously improved.

Figure 5:
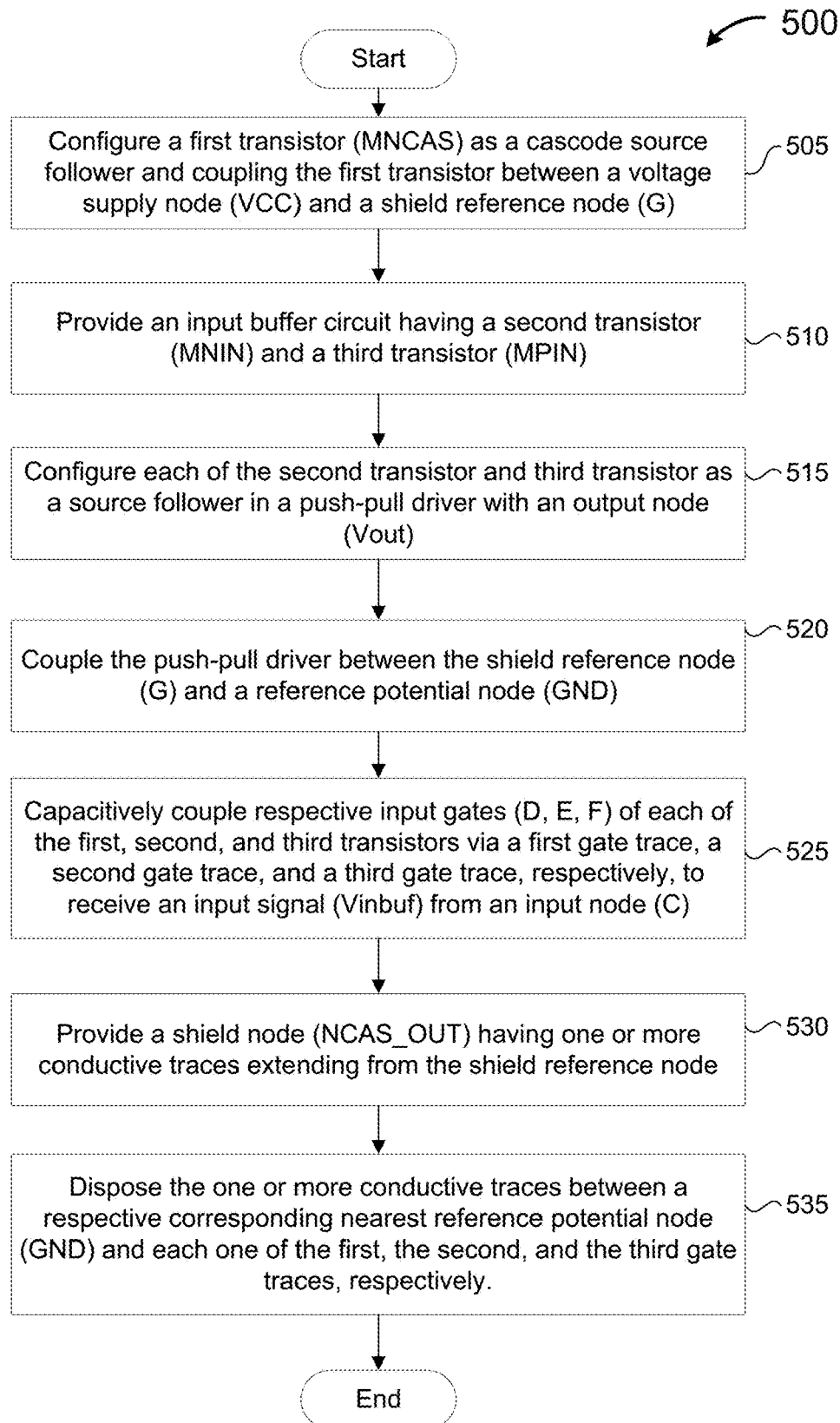
FIG. 5 depicts a flow chart of an exemplary method to implement the parasitic capacitor compensated input buffer.

FIG. 5 depicts a flow chart of an exemplary method to implement the parasitic capacitor compensated input buffer. A method 500 to implement a parasitic capacitor compensated input buffer (e.g., the input buffer 300) includes, at 505, configuring a first transistor (e.g., the transistor MNCAS) as a cascode source follower and coupling the first transistor between a voltage supply node ($V_{CC}$) and a shield reference node (e.g., node G). The method 500 also include, at 510, providing an input buffer circuit having a second transistor (e.g., the transistor MNIN) and a third transistor (e.g., the transistor MPIN). The method 500 also include, at 515, configuring each of the second transistor and third transistor as a source follower in a push-pull driver with an output node (Vout).

The method 500 also include, at 520, coupling the push-pull driver between the shield reference node (e.g., node G) and a reference potential node (e.g., GND). The method 500 also include, at 525, capacitively coupling respective input gates (e.g., gate terminals D, E, F D, E, F) of each of the first, second, and third transistors via a first gate trace, a second gate trace, and a third gate trace, respectively, to receive an input signal (Vinbuf) from an input node (e.g., node C).

The method 500 also include, at 530, providing a shield node (NCAS) having one or more conductive traces extending from the shield reference node. The method 500 also include, at 535, disposing the one or more conductive traces between a respective corresponding nearest reference potential node (GND) and each one of the first, the second, and the third gate traces, respectively. By arranging the positions of the one or more conductive traces extended from the shield reference node, the total parasitic capacitance of the input buffer may be advantageously reduced (e.g., the total parasitic capacitance that impacts the bandwidth of the input buffer is changed from $C_{int}+C_{pin}+C_{p1}+C_{p2}+C_{p3}$ to $C_{int}$). Accordingly, the bandwidth of the input buffer may be advantageously improved. The return loss of the input buffer at high frequency may also be advantageously improved.

Figure 6A:
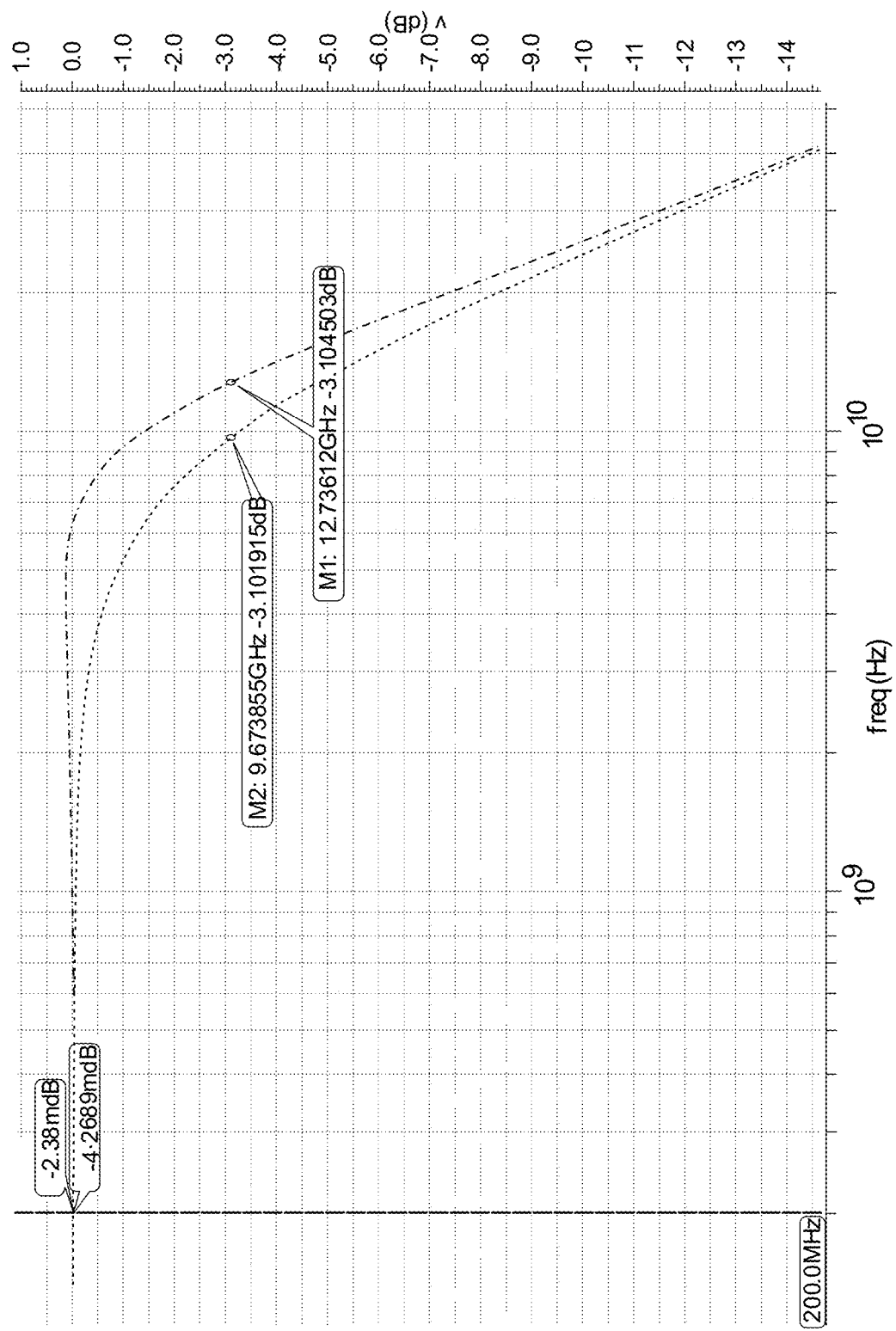
FIGS. 6A-6D depict exemplary simulation results of the parasitic capacitor compensated input buffer's performance.
Figure 6B:
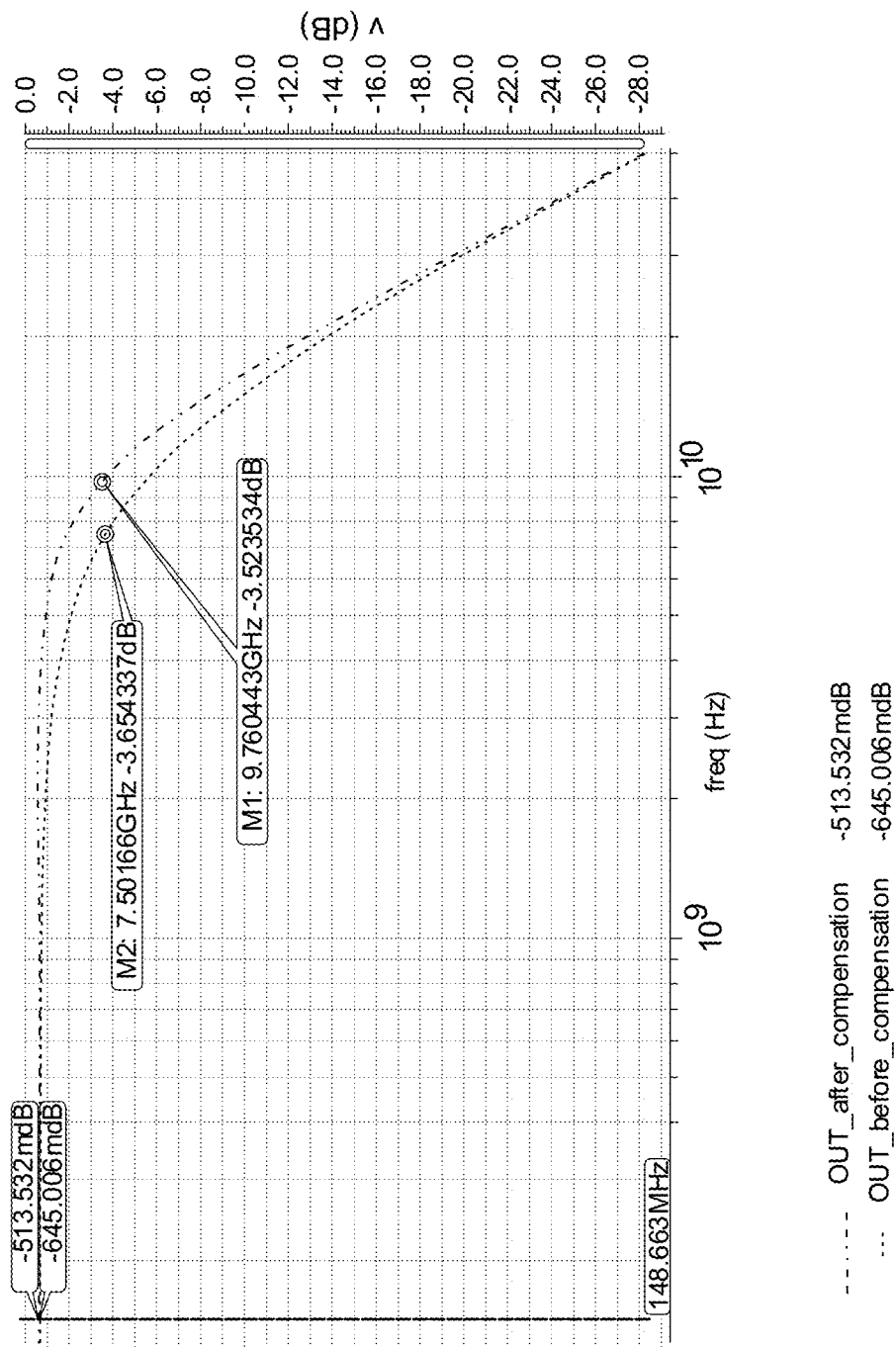
Figure 6C:
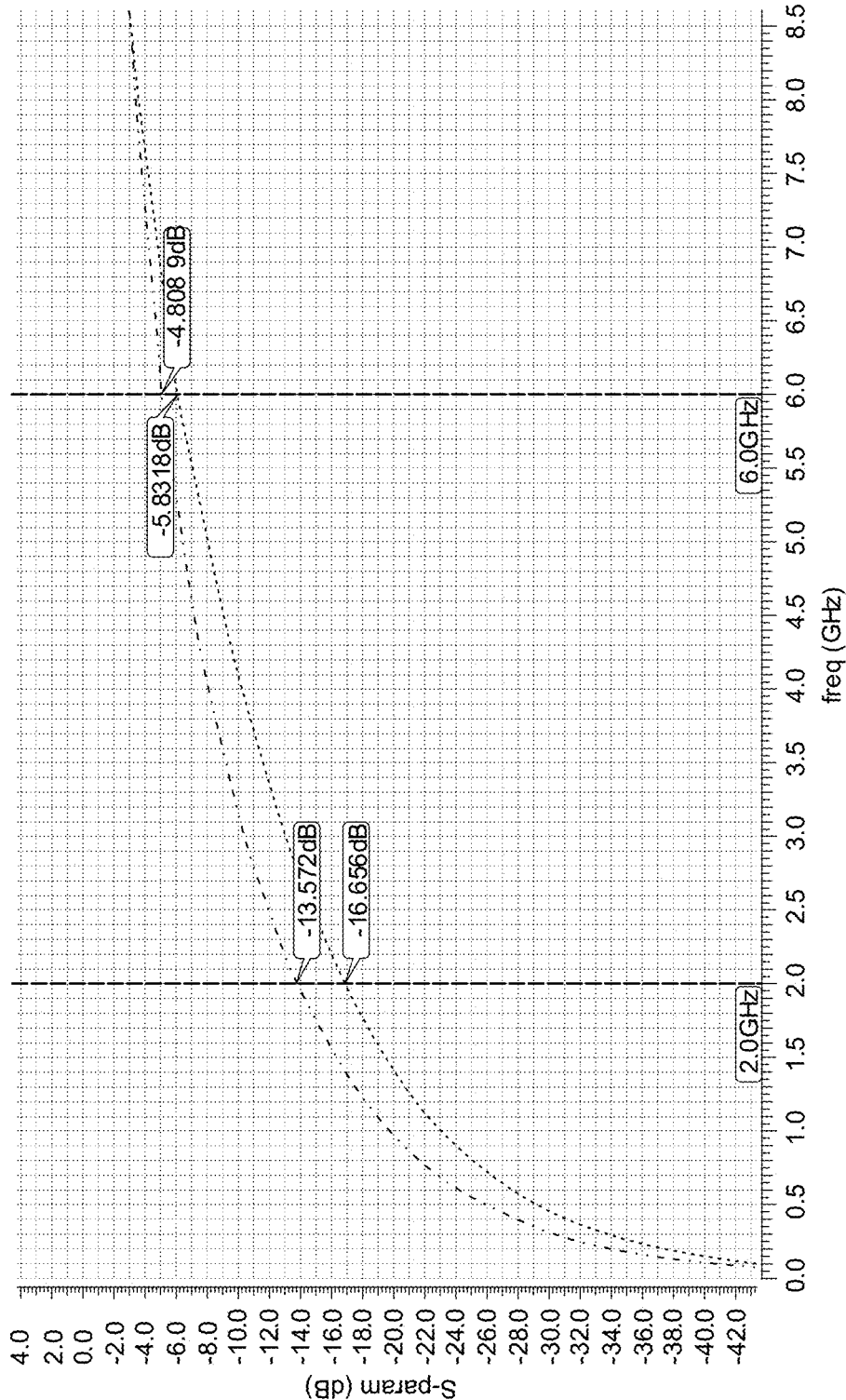
Figure 6D:
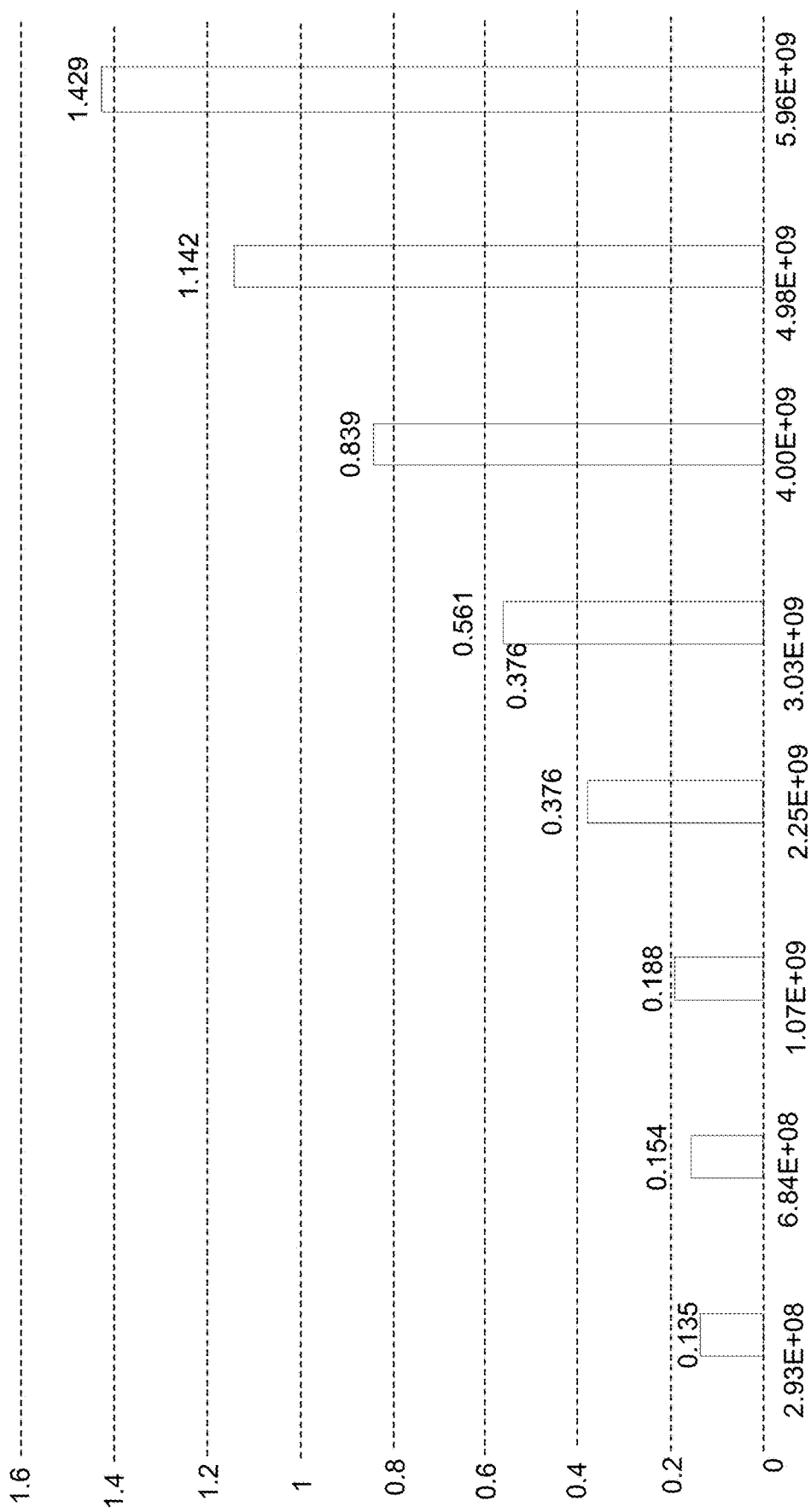

FIGS. 6A-6D depict exemplary simulation results of the parasitic capacitor compensated input buffer's performance. In these depicted simulations, the port impedance (e.g., $Z_0$) and the termination impedance ($Z_T$) are 50 ohms. The capacitances of C1, C2, and C3 are 3 pF. The top plate parasitic capacitances Cp1, Cp2, Cp3 are 60 fF, and the bottom plate related parasitic capacitance $C_{pin}$ is 180 pF. Simulations are done in the Corner environment. As shown in FIG. 6A, after compensation (e.g., shielding some of the parasitic capacitances), the input 3 dB bandwidth of the input buffer is improved by 32%. The output 3 dB bandwidth the input buffer is also improved by 30%, as shown in FIG. 6B. The return loss of the input buffer is also simulated. In this simulation, at 2 GHz, the return loss of the input buffer is improved from −13.572 dB to −16.656 dB. FIG. 6D is an alternate explanation of the improvement in 3 dB bandwidth. In a normal scenario, an input amplitude selected to support a fixed output signal amplitude may increase as frequency increases because of the losses due to a smaller 3 dB bandwidth. Since the 3 dB bandwidth is increased, the input signal amplitude needed to support the same fixed output signal amplitude may be advantageously reduced. The difference between the two input amplitudes (before and after capacitance shielding) plotted across frequency is what is shown in FIG. 6D. For example, at 5.96 GHz, one need to apply 1.429 dB higher input amplitude (and so power) for the same buffer output signal amplitude compared to a case after shielding the parasitic capacitances.

In the previous example (described with reference to FIG. 2), the ADC 230 (having the input buffer 245) is arranged on the same integrated circuit (e.g., IC 200) with the filter 215 and amplifier 220. In another embodiment, the ADC 230 may be implemented in a different integrated circuit (e.g., another programmable logic) to perform signal conversion. In some embodiments, the ADC 230 may be implemented as a hard block fixed circuitry. For example, an application specific integrated circuit (ASIC) may provide analog-to-digital conversion with customized hardware circuitry.

In some embodiments, some or all of the functions of the ADC 230 may be implemented in a processor that is configured to execute a set of instructions stored in a data store to control sampling, for example. The ADC 230 and the data store may be implemented in a programmable logic block of a system-on-chip (SOC) or implemented in a hard block using fixed circuitry of the SOC, and other devices in the IC 200 may be implemented in another hard block using, for example, fixed circuitry of the SOC.

Figure 7:
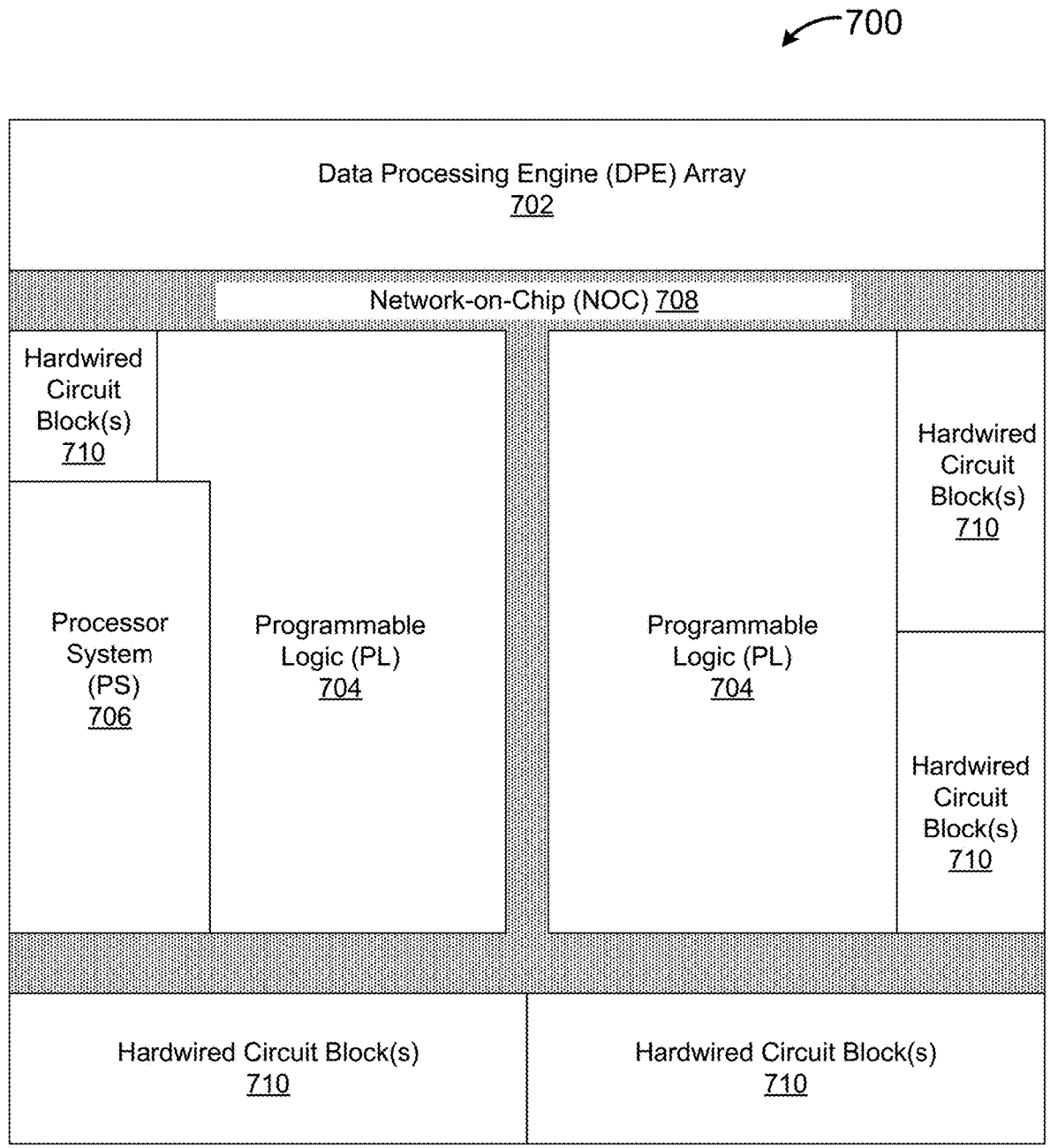
FIG. 7 depicts an exemplary system-on-chip (SOC) platform on which the disclosed circuits and processes may be implemented.

FIG. 7 depicts an exemplary system-on-chip (SOC) platform on which the disclosed circuits and processes may be implemented. SOC 700 is an example of a programmable IC and an integrated programmable device platform. In the example of FIG. 7, the various, different subsystems or regions of the SOC 700 illustrated may be implemented on a single die provided within a single integrated package. In other examples, the different subsystems may be implemented on a plurality of interconnected dies provided as a single, integrated package.

In the example, the SOC 700 includes a plurality of regions having circuitry with different functionalities. In the example, the SOC 700 optionally includes a data processing engine (DPE) array 702. SOC 700 includes programmable logic (PL) regions 704 (hereafter PL region(s) or PL), a processing system (PS) 706, a Network-on-Chip (NOC) 708, and one or more hardwired circuit blocks 710. DPE array 702 is implemented as a plurality of interconnected, hardwired, and programmable processors having an interface to the other regions of the SOC 700.

PL 704 is circuitry that may be programmed to perform specified functions. As an example, PL 704 may be implemented as field programmable gate array type of circuitry. PL 704 can include an array of programmable circuit blocks. Examples of programmable circuit blocks within PL 704 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 704 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 706 is implemented as hardwired circuitry that is fabricated as part of the SOC 700. The PS 706 may be implemented as, or include, any of a variety of different processor types each capable of executing program code. For example, PS 706 may be implemented as an individual processor, e.g., a single core capable of executing program code. In another example, PS 706 may be implemented as a multicore processor. In still another example, PS 706 may include one or more cores, modules, co-processors, interfaces, and/or other resources. PS 706 may be implemented using any of a variety of different types of architectures. Example architectures that may be used to implement PS 706 may include, but are not limited to, an ARM processor architecture, an x86 processor architecture, a GPU architecture, a mobile processor architecture, a DSP architecture, or other suitable architecture that is capable of executing computer-readable instructions or program code.

NOC 708 includes an interconnecting network for sharing data between endpoint circuits in SOC 700. The endpoint circuits can be disposed in DPE array 702, PL regions 704, PS 706, and/or in hardwired circuit blocks 710. NOC 708 can include high-speed data paths with dedicated switching. In an example, NOC 708 includes horizontal paths, vertical paths, or both horizontal and vertical paths. The arrangement and number of regions shown in FIG. 7 is merely an example. The NOC 708 is an example of the common infrastructure that is available within the SOC 700 to connect selected components and/or subsystems.

NOC 708 provides connectivity to PL 704, PS 706, and to selected ones of the hardwired circuit blocks 710. NOC 708 is programmable. In the case of a programmable NOC used with other programmable circuitry, the nets that are to be routed through NOC 708 are unknown until a user circuit design is created for implementation within the SOC 700. NOC 708 may be programmed by loading configuration data into internal configuration registers that define how elements within NOC 708 such as switches and interfaces are configured and operate to pass data from switch to switch and among the NOC interfaces.

NOC 708 is fabricated as part of the SOC 700 and while not physically modifiable, may be programmed to establish connectivity between different master circuits and different slave circuits of a user circuit design. NOC 708, for example, may include a plurality of programmable switches that are capable of establishing packet switched network connecting user specified master circuits and slave circuits. In this regard, NOC 708 is capable of adapting to different circuit designs, where each different circuit design has different combinations of master circuits and slave circuits implemented at different locations in the SOC 700 that may be coupled by NOC 708. NOC 708 may be programmed to route data, e.g., application data and/or configuration data, among the master and slave circuits of the user circuit design. For example, NOC 708 may be programmed to couple different user-specified circuitry implemented within PL 704 with PS 706, and/or DPE array 702, with different hardwired circuit blocks, and/or with different circuits and/or systems external to the SOC 700.

The hardwired circuit blocks 710 may include input/output (I/O) blocks, and/or transceivers for sending and receiving signals to circuits and/or systems external to SOC 700, memory controllers, or the like. Examples of different I/O blocks may include single-ended and pseudo differential I/Os and high-speed differentially clocked transceivers. Further, the hardwired circuit blocks 710 may be implemented to perform specific functions. Examples of hardwired circuit blocks 710 include, but are not limited to, cryptographic engines, digital-to-analog converters, analog-to-digital converters, and the like. The hardwired circuit blocks 710 within the SOC 700 may be referred to herein from time-to-time as application-specific blocks.

In the example of FIG. 7, PL 704 is shown in two separate regions. In another example, PL 704 may be implemented as a unified region of programmable circuitry. In still another example, PL 704 may be implemented as more than two different regions of programmable circuitry. The particular organization of PL 704 is not intended as a limitation. In this regard, SOC 700 includes one or more PL regions 704, PS 706, and NOC 708. DPE array 702 may be optionally included.

In other example implementations, the SOC 700 may include two or more DPE arrays 702 located in different regions of the IC. In still other examples, the SOC 700 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. For example, the circuit in discussion is an analog buffer. And this analog buffer may be a highly linear wide band buffer which may support from DC to RF frequencies. The use of the input buffer may not be limited to an ADC front end. The buffer may, for example, take a place between any to sub blocks of an RF system. For example, the input buffer may be arranged between a low noise amplifier (LNA) and a mixer. The input buffer may also be arranged between a mixer and an ADC, for example. Maximizing the bandwidth of the buffer using the technique presented may be favorable in these cases.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit, comprising:
 a first transistor configured as a cascode source follower between a voltage supply node and a shield reference node;
 an input buffer circuit comprising a second transistor and a third transistor each configured as a source follower in a push-pull driver with an output node, the push-pull driver coupled between the shield reference node and a reference potential node, the shield reference node directly connecting the first transistor to the second transistor, wherein each of the first, second, and third transistors comprise respective input gates that are each capacitively coupled via a first gate trace, a second gate trace, and a third gate trace, respectively, to receive an input signal from an input node; and
 a shield node providing one or more conductive traces extending from the shield reference node and disposed, respectively, between each one of the first, the second, and the third gate traces and a respective corresponding nearest reference potential node.

2. The circuit of claim 1, further comprising:
 a first capacitor, a second capacitor, and a third capacitor each having a respective first plate and a respective second plate, wherein each of respective first plates is electrically connected to the input node, and each of respective second plates is electrically connected to the respective input gates via the first gate trace, the second gate trace, and the third gate trace, respectively.

3. The circuit of claim 1, wherein at least one of the one or more conductive traces extending from the shield reference node are disposed on an intermediate layer between a first layer containing the input gates and a second layer containing the reference potential.

4. The circuit of claim 1, wherein at least one of the one or more conductive traces extending from the shield reference node are disposed on a layer containing the input gates and the reference potential.

5. The circuit of claim 1, wherein the shield node further providing one or more conductive traces extending from the shield reference node and disposed between the input node and a corresponding nearest reference potential node.

6. The circuit of claim 5, wherein the one or more conductive traces extending from the shield reference node and disposed between the input node and a corresponding nearest reference potential node are disposed on an intermediate layer between a first layer containing the input gates and a second layer containing the reference potential.

7. The circuit of claim 5, wherein the one or more conductive traces extending from the shield reference node and disposed between the input node and a corresponding nearest reference potential node are disposed on a layer containing the input gates and the reference potential.

8. The circuit of claim 5, wherein the reference potential node comprises a circuit ground.

9. The circuit of claim 1, wherein the first transistor and the second transistor are N-type metal-oxide semiconductor field-effect-transistors (NMOSFETs).

10. The circuit of claim 1, wherein the third transistor comprises a P-type metal-oxide semiconductor field-effect-transistor (PMOSFET).

11. The circuit of claim 1, further comprising: an analog-to-digital converter (ADC) coupled to the output node.

12. The circuit of claim 1, further comprising:
a first resistor having a first terminal and a second terminal, wherein the first terminal is configured to receive a source voltage signal, and the second terminal is coupled to the input node; and
a termination resistor having a third terminal and a fourth terminal, wherein the third terminal is coupled to the input node, and the fourth terminal is coupled to a low impedance voltage level.

13. A method, comprising:
configuring a first transistor as a cascode source follower and coupling the first transistor between a voltage supply node and a shield reference node;
providing an input buffer circuit having a second transistor and a third transistor;
configuring each of the second transistor and third transistor as a source follower in a push-pull driver with an output node;
coupling the push-pull driver between the shield reference node and a reference potential node, the shield reference node directly connecting the first transistor to the second transistor;
capacitively coupling respective input gates of each of the first, second, and third transistors via a first gate trace, a second gate trace, and a third gate trace, respectively, to receive an input signal from an input node;
providing a shield node having one or more conductive traces extending from the shield reference node; and
disposing the one or more conductive traces between a respective corresponding nearest reference potential node and each one of the first, the second, and the third gate traces, respectively.

14. The method of claim 13, wherein the capacitively coupling comprises:
providing a first capacitor, a second capacitor, and a third capacitor each having a respective first plate and a respective second plate;
electrically connecting each respective first plate of the first capacitor, the second capacitor, and the third capacitor to the input node; and
electrically connecting each respective second plate of the first capacitor, the second capacitor, and the third capacitor to the respective input gates via the first gate trace, the second gate trace, and the third gate trace, respectively.

15. The method of claim 13, wherein at least one of the one or more conductive traces extending from the shield reference node is disposed on an intermediate layer between a first layer containing the input gates and a second layer containing the reference potential.

16. The method of claim 13, wherein at least one of the one or more conductive traces extending from the shield reference node are disposed on a layer containing the input gates and the reference potential.

17. The method of claim 13, wherein the shield node further providing one or more conductive traces extending from the shield reference node and disposed between the input node and a corresponding nearest reference potential node.

18. The method of claim 17, wherein the one or more conductive traces extending from the shield reference node and disposed between the input node and a corresponding nearest reference potential node are disposed on an intermediate layer between a first layer containing the input gates and a second layer containing the reference potential.

19. The method of claim 17, wherein the one or more conductive traces extending from the shield reference node and disposed between the input node and a corresponding nearest reference potential node are disposed on a layer containing the input gates and the reference potential.

20. The method of claim 13, wherein the reference potential node comprises a circuit ground.

* * * * *